TRANSISTORIZED TIMING CIRCUIT

Filed Oct. 24, 1957 2 Sheets-Sheet 1

INVENTORS
FREDERICK W. CHESSON
LOISIUS J. A. VAN LIESHOUT
BY
Russell G. Pelton
ATTORNEY Feb. 2, 1960 F. W. CHESSON ET AL 2,923,863

TRANSISTORIZED TIMING CIRCUIT

Filed Oct. 24, 1957 2 Sheets-Sheet 2

INVENTORS
FREDERICK W. CHESSON
LOISIUS J. A. VAN LIESHOUT
BY
Russell O. Pelton
ATTORNEY

United States Patent Office 2,923,863

Patented Feb. 2, 1960

2,923,863

TRANSISTORIZED TIMING CIRCUIT

Frederick W. Chesson, Waterbury, and Loisius J. A. van Lieshout, Hamden, Conn., assignors to Consolidated Electronics Industries Corp., New York, N.Y., a corporation of Delaware Application October 24, 1957, Serial No. 692,161

3 Claims. (Cl. 317—148.5)

This invention relates to timing circuits and particularly to transistor-operated time delay circuits.

Figure 1:
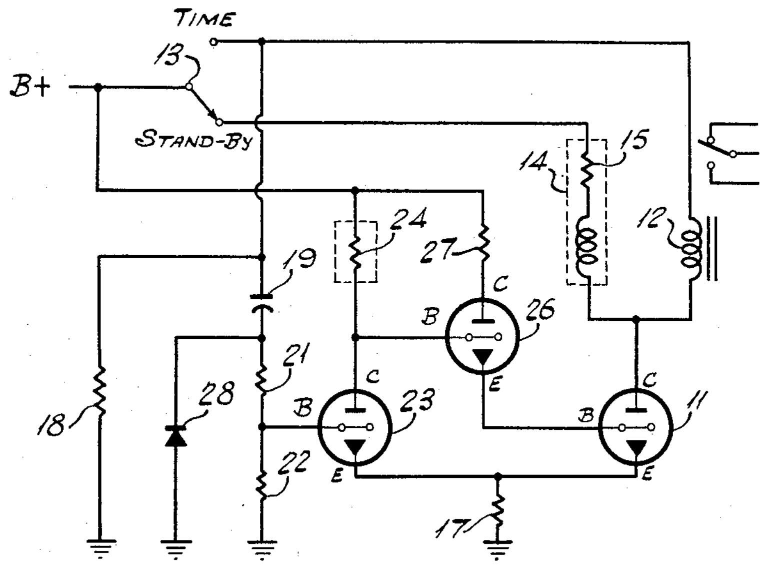
Figure 2A:
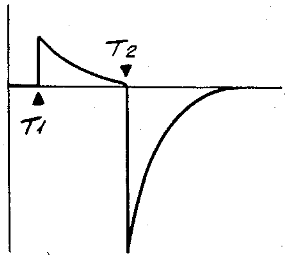
Figure 2B:
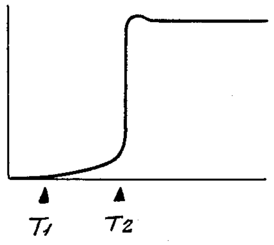
Figure 3:
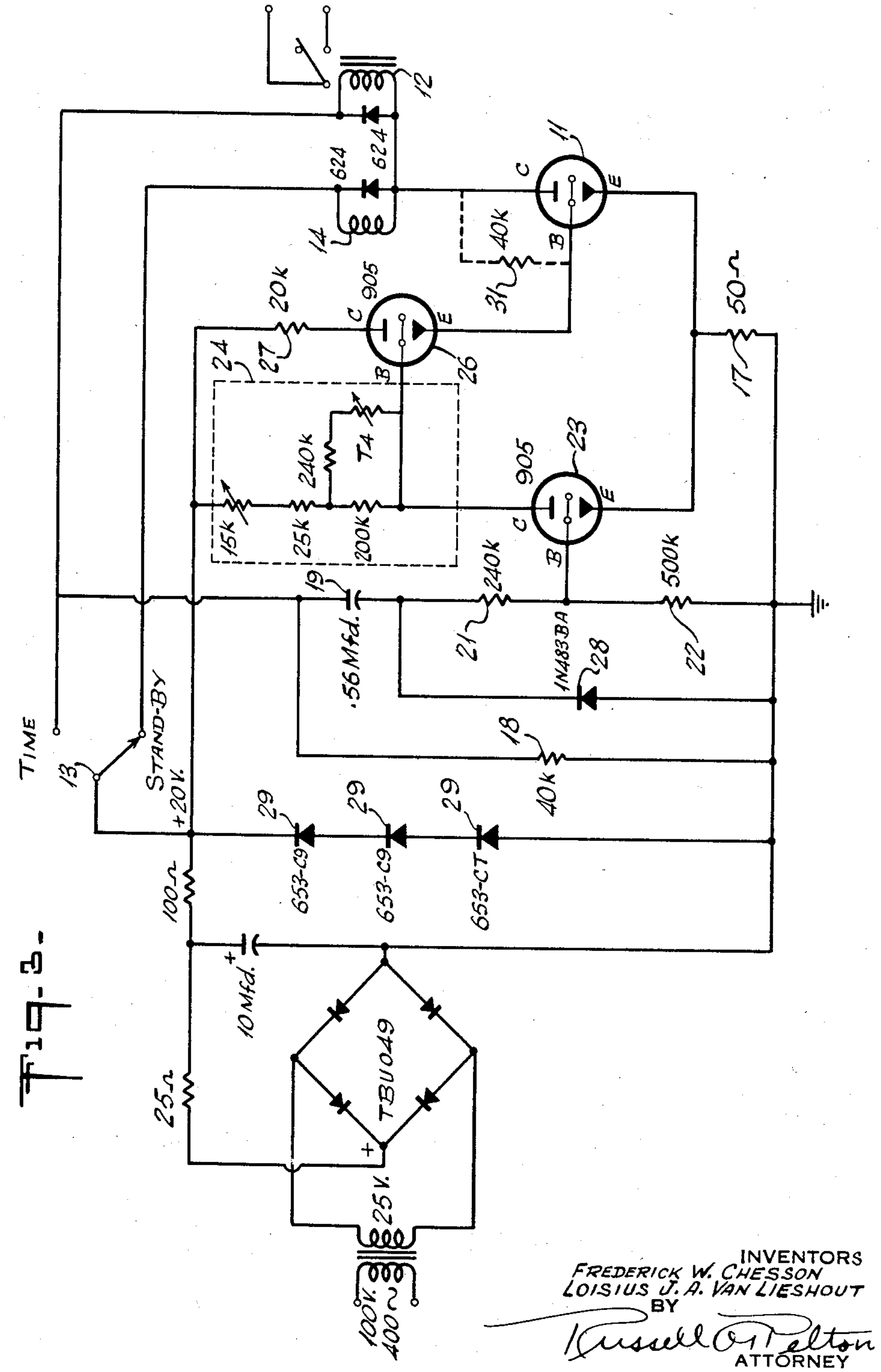

The primary object of the invention is to provide a stable timing circuit using transistors and having a high degree of accuracy in spite of fluctuating operating voltage and adverse environmental conditions. Other objects will be apparent from the following specification together with the drawings in which:

Fig. 1 is a simplified circuit diagram of a timing circuit connected according to the invention;

Figs. 2*a* and 2*b* show electrical waveforms obtained in the operation of the circuit in Fig. 1; and Fig. 3 shows a modified form of the circuit of Fig. 1 including additional improvements.

In its simplest form the invention comprises an output transistor with an output load connected in its collector circuit. At the start of a timing period the transistor is made non-conductive and remains so for a pre-determined time delay after which it suddenly becomes conductive again. The length of delay time is primarily determined by a time-constant circuit, which is connected to, and controls the current in, a second transistor. This second transistor is connected so as to control conduction of the output transistor, and at the end of the above-mentioned pre-determined time delay, current in the time-constant circuit, amplified by the second transistor and applied to the output transistor, causes the latter suddenly to become conductive and to amplify the current many times more, thereby energizing the output load.

In order to improve the suddenness with which the output transistor resumes full conduction, a feedback connection is provided between input electrode leads of both transistors. The result of providing such a feedback path is that the initiation of current flow in the output transistor is immediately reflected to the second transistor to increase the rate of change of current therein, which, in turn, is applied to the output transistor.

A third transistor may also be provided to couple the output signal of the second transistor more efficiently to the input circuit of the output transistor and to promote more precise timing.

In order to provide uniform current drain on the power supply and constant heating of the circuit, a dummy load and a switch may be connected to the collector of the output transistor so that the transistor can draw the same current through the dummy load during stand-by periods that it draws through the output load after each delay time has ended.

The circuit in Fig. 1 utilizes three n-p-n junction transistors, although other types could be used by making suitable, well-known voltage inversions. The collector of the output transistor 11 is connected through an output load circuit in the form of a relay 12 to one contact, labeled Time, of a single-pole-double-throw switch 13. The collector is also connected through a dummy load 14, which includes an inherent resistance 15, to the other contact, labeled Stand-By, of the switch. The arm of the switch is connected to the positive pole of a B supply, and the emitter-collector current circuit of the transistor is completed by means of a resistor 17 connected to the negative, or ground, terminal of the B supply.

In the position of the switch 13 shown, collector current of transistor 11 passes through the dummy load, creating a voltage drop across the inherent resistance 15. The emitter current, which is approximately equal to the collector current, flows through resistor 17, creating a biasing voltage thereacross. Only a very small current flows through the winding of relay 12, not nearly enough to actuate the relay. This small current passes through a relatively high-impedance resistor 18.

A time-constant circuit comprising a condenser 19 and resistors 21 and 22 is connected in series between the Time contact of switch 13 and ground. When the arm of switch 13 is connected to the Stand-By terminal, transistor 11 conducts and the voltage between its collector and ground is a small fraction of the B supply voltage. This means that the voltage across the condenser 19 during the stand-by period will be likewise insignificant, and the condenser can be considered to be in a discharged condition. The voltage across resistors 21 and 22 will be zero.

A second transistor 23 is connected so as to be conductive when, and substantially only when, transistor 11 is non-conductive. The collector of transistor 23 is connected through an impedance 24 to the positive pole of the B supply. The emitter of transistor 23 is connected to the emitter of transistor 11, and the base of transistor 23 is connected to the junction of resistors 21 and 22. Because of the relatively low base-emitter impedance of the transistor, resistor 22 has relatively little effect on the transient current, and the time-constant is determined primarily by condenser 19 and resistor 21.

Since the stand-by voltage across resistors 21 and 22 (and therefore the voltage at the base of transistor 23) is zero, while the voltage on the emitter is positive by the voltage drop across resistor 17, transistor 23 is biased to a non-conductive condition during stand-by.

Actuation of switch 13 to start the delay period halts the current through the dummy load 14 and the collector-emitter circuit of transistor 11, thereby removing the voltage drop across resistor 17. In addition, the upper terminal of condenser 19 is connected directly to the positive pole of the B supply, which may be only fractionally higher than the voltage at the upper terminal prior to actuation of the switch. According to well-known transient current theory, the voltage across the condenser cannot change instantaneously, and so the voltage at the junction of condenser 19 and resistor 21 will rise by the same amount as the voltage at the upper terminal of condenser 19. The base voltage of transistor 23 will follow (to a lesser degree) and transistor 23 will thereupon be biased to the conductive condition, which will cause a significant collector current to flow through resistor 24, resulting in an increased voltage drop thereacross and depressing the voltage at the collector of transistor 23.

A third transistor 26 is provided to connect the output signal at the collector of transistor 23 more efficiently to the base input terminal of transistor 11. The base of transistor 26 is connected to the collector of transistor 23 to be controlled by the current therefrom and the collector of transistor 26 is connected through a voltage-dropping resistor 27 to the positive pole of the B supply. The emitter of transistor 26 is connected to the base of transistor 11 so that transistors 11 and 26 are changed from the conductive state to the non-conductive, and vice versa, substantially simultaneously.

Thus, during stand-by, transistor 26 is conductive, and its relatively small base current flows through resistor 24, adding to any residual collector current for transistor 23 which might also be flowing therethrough, and establishing a certain voltage level at the collector of transistor 23 and the base of transistor 26. The collector current of transistor 26 is substantially equal to the emitter current thereof, all of which flows through the base of transistor 11 and controls the amount of current flowing in the dummy load 14. Upon actuation of the switch 13 and the concomitant transfer of the conductive state from transistor 11 to transistor 23, the relatively large collector current which will thereupon be drawn through resistor 24 by transistor 23 will depress the voltage at the base of transistor 26 below its stand-by level and will cause the collector-emitter current of transistor 26 to cease. This, in turn, causes the base current of transistor 11 to cease and assures that no actuating current will flow through the winding of relay 12, even after sufficient time has passed (governed by the inherent inductance and resistance of the winding) to permit actuating current to flow.

Instead, both transistors 11 and 26 remain non-conductive, while the current through the time-constant circuit condenser 19 and resistor 22 subsides exponentially after its initial upward jump. This exponential current is amplified by transistor 23 and manifests itself as a substantially exponential upward trend in the voltage at the base of transistor 26. At some voltage level, transistor 26 will again return to the conductive state, causing its emitter current to flow into the base of transistor 11 and likewise returning it on conductivity.

Because of the overall amplification in transistors 23, 26, and 11 of the exponential current into the base of transistor 23, transistor 11 will progress very rapidly from the non-conductive state, in which its collector voltage will be approximately at the level of the positive pole of the B supply, to the conductive state, in which the low emitter-collector impedance will bring the collector suddenly down toward the voltage level of the emitter, thereby applying full operating voltage across the winding of relay 12. Thus, at the end of the prescribed time delay, relay 12 is actuated. At any desired time thereafter the arm of switch 13 may be thrown back to the Stand-By contact, whereupon current through relay 12 will be cut off and a substantially equal current will shortly start to flow through the dummy load 14. The reason for an equal current is to maintain substantially uniform heating of the equipment and uniform current drain on the B supply.

A diode 28 having high back resistance (so as not to interfere with the exponential decay of current through the time-constant circuit) may be connected between the ground and the junction of condenser 19 and resistor 21, as shown, to reduce the length of time required to discharge condenser 19 to its standby level and prepare for another timing operation. The purpose of resistor 18 is further to aid discharge of condenser 19 to its stand-by voltage level.

The waveforms in Figs. 2*a* and 2*b* depict, respectively, typical variations of the base-emitter voltage of transistor 23 and variations of the voltage across the winding of relay 12 in Fig. 1. Fig. 2*a* shows the initial positive surge of voltage on the base of transistor 23 at time $T_1$, which is the time the arm of switch 13 is moved to the Time contact from the Stand-By contact. The exponential decay of this base voltage following the initial positive surge continues until time $T_2$ at which time an amplified and inverted version of the voltage shown in Fig. 2*a* causes the base of transistor 26 to rise to the proper level for conduction. The effect of the resultant sudden shift of transistors 26 and 11 from the non-conductive to the conductive state is fed back to the emitter of transistor 23 via the common connection of the latter emitter with the emitter of transistor 11 and produces the negative surge in the base-emitter voltage waveform. Actually, this negative-appearing wave is produced by a positive voltage created across resistor 17 by the relatively high current through it from the output transistor 11, and it is only because Fig. 2*a* depicts the voltage of the base of transistor 23 with respect to its emitter that the waveform goes negative at time $T_2$.

Fig. 2*b* shows that no voltage is applied across the winding of relay 12 prior to time $T_1$, as indeed would be expected from the fact that up until that time the dummy load 14, rather than relay 12, was connected directly to the B supply. Even after switch 13 is actuated at time $T_1$, the voltage across relay 12 remains negligible during the time delay period between $T_1$ and $T_2$. By virtue of the sudden return of transistor 11 to the conductive state at time $T_2$, a large pare of the B supply voltage is placed across relay 12, allowing the relay to operate sharply and positively at the pre-determined time $T_2$, with no oscillation or indeterminateness of the relay energizing voltage.

Fig. 2 shows the circuit of Fig. 1 in a complete, operable timer adjusted to provide a 250 millisecond delay between the time $T_1$ when switch 13 is actuated and the time $T_2$ when relay 12 operates. The components of Fig. 3 which correspond to those in Fig. 1 are labelled with the same reference characters. Component values are stated to spell out a workable circuit, although, of course, the invention is not limited to the values shown.

Relay 12 is a sensitive unit operating on as little as 95 milliwatts, although for the sake of uniform operation, more than the minimum power is provided in this circuit; a voltage of about 16 volts is applied across the relay winding at a current of 12 milliamperes.

In order to stabilize the operation of the circuit, three reference voltage diodes 29 are provided in the B supply to limit its output to 20 volts. In addition, resistor 24 is made up of a network of resistors and one thermistor to provide temperature compensation, the network having an overall resistance of about 200,000 ohms. A resistor 31 may be connected as shown between the base and collector of transistor 11 to provide better warmup characteristics by getting the timing stabilized at the desired value very soon after the circuit is first put into operation. Once the circuit has warmed up, it is kept at a relatively constant temperature, which is most desirable for maintaining uniform operating characteristics of the transistors, by the heat dissipated by current through the dummy load 14 when current is not being drawn through relay 12. This dummy load may consist of 1400 turns of #44 copper wire or an equivalent resistor.

While the circuit has been considered in detail in connection with but a single embodiment, it will be obvious to those skilled in the art that numerous modifications may be made therein without departing from the inventive concept as set forth in the following claims.

What is claimed is:

1. A timing circuit comprising: an output transistor having a collector electrode, and a pair of input electrodes; an output load connected to said collector; a dummy load connected to said collector; a B supply; a switch to connect said B supply to said dummy load during stand-by periods and to said output load to start each timing period; a time-constant circuit and means to introduce a transient current therein at the start of each said timing period; a second transistor having an input electrode connected to said time-constant circuit to be controlled by said transient current, a collector, and a third electrode; circuit means connecting the collector of said second transistor to one of said input electrodes of said output transistor to supply to the latter an amplified version of said transient current, the junction of said collector and output load; a B supply source; a switch having an arm connected to said source, a first terminal connected to said dummy load and a second terminal connected to said output load to supply collector current alternately through said dummy load and said output load to said transistor; a second transistor having a collector, a base, and an emitter; a temperature-compensated load connecting said last-named collector to said B supply; a direct, positive feedback connection between both said emitters whereby current through one of said transistors drives the other to the non-conductive state; a resistor connected between said feedback connection and the opposite pole of said B supply; a resistance-capacitance time-constant circuit connected between said second terminal of said switch and the base of said second transistor said output transistor being biased to a non-conductive state from the time said switch is actuated to connect said output load to the B supply until the time said transient current reaches a pre-determined level, at which latter time said output transistor suddenly becomes conductive; and a positive feedback connection from the remaining input electrode of said output transistor to said third electrode of said second transistor to increase the suddenness with which said output transistor resumes full conduction once said pre-determined level of said transient current has been reached.

2. A timing circuit comprising: an output transistor having an emitter, a base, and a collector; a B voltage supply; a switch having two contacts and an arm, said arm being connected to one terminal of said B supply; an output load connected from said collector to a first one of said contacts; a dummy load having substantially the same impedance as said output load and connected from said collector to a second one of said contacts; a second transistor having an emitter connected directly to the emitter of said output transistor, and having a base and a collector; a constant load impedance connected from the collector of said second transistor to said terminal of said B supply; a time constant circuit comprising a resistor and a capacitor connected in series between the base of said second transistor and said first one of said contacts; a feedback resistor connected from the emitters of said transistors to a second terminal of said B supply of opposite polarity to said one terminal; a third transistor having a base connected directly to the collector of said second transistor, an emitter connected directly to the base of said output transistor, and a collector; a voltage-dropping resistor connected from said last-named collector to said one terminal of said B supply to control the current into the base of said output transistor; and a diode having a high back-resistance connected from said second terminal of said B supply to the junction of said resistor and said capacitor and polarized to be non-conductive while said condenser is charging up during timing periods immediately after the arm of said switch is thrown into connection with said first one of said contacts and to be non-conductive so as to discharge said condenser quickly when said arm is returned to said second one of said contacts.

3. A timing circuit comprising: a first, normally conductive transistor having a collector, an emitter, and a base; a relay having a winding connected in series with said collector to be energized by collector current; a second, normally non-conductive transistor having a collector, an emitter, and a base; a source of operating voltage; a conductive connection between the emitters of said transistors to feed back voltage variations from one emitter to the other and increase the positiveness of operation of said circuit; a resistor connected in series between said conductive connection and one terminal of said voltage source; a collector load resistor connected in series with the collector of said second transistor; a coupling transistor having a base connected to the collector of said second transistor, an emitter connected to the base of said output transistor, and a collector; a current-limiting resistor connected in series with the collector of said coupling transistor to limit the current flowing through the collector-emitter circuit of said coupling transistor into the base of said output transistor; a time constant network connected to the base of said second transistor and comprising a timing resistor and a capacitor; and a switch connected to said time constant network and to said voltage source to start the timing operation of the circuit when said switch is closed whereby said second transistor is made conductive and said coupling transistor and output transistor are made non-conductive until, at a delayed time after said switch is closed, the transient voltage induced in said time constant network reduces to a pre-determined level at which an amplified replica of the transient voltage returns the voltage level at the base of said coupling transistor suddenly to a conductive condition, thereby permitting current to flow through said coupling transistor into the base of said output transistor, returning said output transistor to the conductive state and energizing said relay.

References Cited in the file of this patent

UNITED STATES PATENTS

| | | |
|---|---|---|
| 2,476,389 | Schmidt | July 19, 1949 |
| 2,814,736 | Hamilton | Nov. 26, 1957 |
| 2,827,574 | Schneider | Mar. 18, 1958 |
| 2,828,450 | Pinckaers | Mar. 25, 1958 |